(12) United States Patent
Takahashi et al.

(10) Patent No.: US 6,381,152 B1
(45) Date of Patent: Apr. 30, 2002

(54) METHOD OF DRIVING SEMICONDUCTOR SWITCHING DEVICE IN NON-SATURATED STATE AND POWER SUPPLY APPARATUS CONTAINING SUCH A SWITCHING DEVICE

(75) Inventors: Tadashi Takahashi; Kenichi Onda; Norikazu Tokunaga; Takeshi Onaka, all of Hitachi; Ryouhei Saga, Takasaki; Katsunori Hayashi, Odawara, all of (JP)

(73) Assignees: Hitachi, Ltd., Tokyo; Hitachi Tohbu Semiconductor, Ltd., Takasaki, both of (JP)

( * ) Notice: Subject to any disclaimer, the term of this patent is extended or adjusted under 35 U.S.C. 154(b) by 0 days.

(21) Appl. No.: 09/651,722

(22) Filed: Aug. 30, 2000

(30) Foreign Application Priority Data

Mar. 30, 2000 (JP) ........................................ 2000-097828

(51) Int. Cl.⁷ ........................ H02M 3/335; H02H 7/122
(52) U.S. Cl. ................ 363/21.06; 363/21.1; 363/21.09; 363/55
(58) Field of Search ........................... 363/21.04, 21.06, 363/21.07, 21.1, 21.09, 55, 97

(56) References Cited

U.S. PATENT DOCUMENTS

| | | | |
|---|---|---|---|
| 4,357,654 A | * 11/1982 | Ikenoue et al. | 363/21.06 |
| 5,428,523 A | 6/1995 | McDonnal | 363/71 |
| 5,726,869 A | * 3/1998 | Yamashita et al. | 363/21.06 |
| 6,101,104 A | * 8/2000 | Eng | 363/21.06 |
| 6,130,828 A | * 10/2000 | Rozman | 363/21.06 |

FOREIGN PATENT DOCUMENTS

| | | | |
|---|---|---|---|
| EP | 0 685 917 A1 | 12/1995 | ............. H02J/1/10 |
| JP | 5-161262 | 6/1993 | ............. H02J/1/00 |
| JP | 6-070544 | 11/1994 | ............. H02M/3/28 |
| JP | 7-005935 | 10/1995 | ............. G05F/1/00 |
| JP | 9-51678 | 2/1997 | ............. H02M/3/28 |
| JP | 11-18415 | 1/1999 | ............. H02M/3/00 |

OTHER PUBLICATIONS

"The Industrial Electronics Handbook", V. Barkhordarian et al, 1997, CRC Press LLC, Boca Raton, FL, USA pp. 220–227 no month.

"Solid–State Power Conversion Handbook", R. E. Tartar, 1993, John Wiley & sons, NY, pp. 74–84 no month.

* cited by examiner

*Primary Examiner*—Bao Q. Vu
(74) *Attorney, Agent, or Firm*—Antonelli, Terry, Stout & Kraus, LLP

(57) ABSTRACT

A power supply apparatus includes a semiconductor switching device for outputting power and a control circuit for controlling the on/off operation of the semiconductor switching device. The control circuit includes a circuit for applying, when turning on the semiconductor switching device, a first control signal corresponding to the difference between the output voltage of the power supply apparatus and a first reference value to the semiconductor switching device in accordance with the increase in the output voltage from the power supply apparatus thereby to operate the semiconductor switching device in a non-saturated area, so that the semiconductor switching device is turned on gradually.

17 Claims, 8 Drawing Sheets

METHOD OF DRIVING SEMICONDUCTOR SWITCHING DEVICE IN NON-SATURATED STATE AND POWER SUPPLY APPARATUS CONTAINING SUCH A SWITCHING DEVICE

BACKGROUND OF THE INVENTION

1. Field of the Invention

The present invention relates to a method of driving a switching device of a power supply apparatus and the power supply apparatus driven by the method.

2. Description of the Related Art

Conventionally, in the case where a plurality of converters are operated in parallel redundancy, each converter is connected to a load through a diode for reverse-current protection. However, the diode has so high a forward voltage drop that the power loss is large. As a measure against this, a semiconductor switching element such as MOSFET is used. In such a case, no problem would be posed if the MOSFET is turned on and connected in parallel to the converter added to the redundant system after the converter is fully activated and the voltage is established. In dynamic attachment and removal, however, the MOSFET is unavoidably turned on/off at a voltage lower than that of the redundant system considering the voltage detection error of the principal converter. A large charge current instantaneously flows through the capacitor of the activated converter from the redundant system, resulting in a large variation in load voltage.

Also in the case where the converter runs out of order when used with the MOSFET, the voltage across the converter gradually drops to such a level that the voltage across the faulty converter becomes lower than that across the redundant system, and the reverse current flows to the faulty converter through the MOSFET from the redundant system until the detection voltage for turning off the MOSFET is reached, thereby causing a large variation of the load voltage.

In the case where the faulty power supply is replaced for activation or the power supply runs out of order, the current of the redundant system is disturbed and the load voltage undergoes a variation when the MOSFET is turned on as described above. Thus, a noise is caused.

SUMMARY OF THE INVENTION

The object of the invention is to provide a highly reliable driving method for a semiconductor switching device used in a power supply apparatus at the time of preventing the reverse current and a power supply apparatus driven by the method.

According to one aspect of the invention, there is provided a driving method for the semiconductor switching device used in a power supply apparatus, in which the semiconductor switching device is not directly turned on but rather is turned on gradually through a non-saturated state.

More specifically, the semiconductor switching device, when turned on, is operated in a non-saturated area gradually in proportion to the difference between the output voltage or the output current of the power supply apparatus and a first reference value in the case where the output voltage or the output current is not less than a first reference value in the case where the output voltage or the output current of the power supply apparatus is not lower than the first reference value. Further, preferably, the semiconductor switching device is turned on fully in the saturated area in the case where the output voltage or the output current increases to not less than a second reference value.

According to another aspect of the invention, there is provided a driving method for the semiconductor switching device of a power supply apparatus, in which a first control signal corresponding to the difference between the output voltage or the output current of the power supply apparatus and the first reference value is applied to the semiconductor switching device at the time of activating the power supply apparatus. Further, a second control signal not smaller than the first control signal is applied to the semiconductor switching device at and after a time point when the output voltage or the output current reaches a second reference value larger than the first reference value.

In the driving method according to the invention, the current is limited when the semiconductor switching device starts to be turned on, and therefore it is possible to prevent such an abrupt current increase as to cause a load variation. The reliability of the power supply apparatus is improved by using the driving method according to the invention in the control circuit for controlling the on/off operation of the semiconductor switching device for outputting the power of the power supply apparatus.

Various semiconductor devices can be used as the semiconductor switching device including an insulated gate transistor such as a MOSFET (metal oxide semiconductor field effector transistor or IGBT (insulated gate bipolar transistor) and a bipolar transistor. In the power supply apparatus, the semiconductor switching device is used for various purposes including the reverse current blocking for parallel operation and various power control means. Also, the converter, the inverter, the switching power supply, and other various power converters and power control devices are used as the power supply apparatus.

DESCRIPTION OF THE EMBODIMENTS

Figure 1:
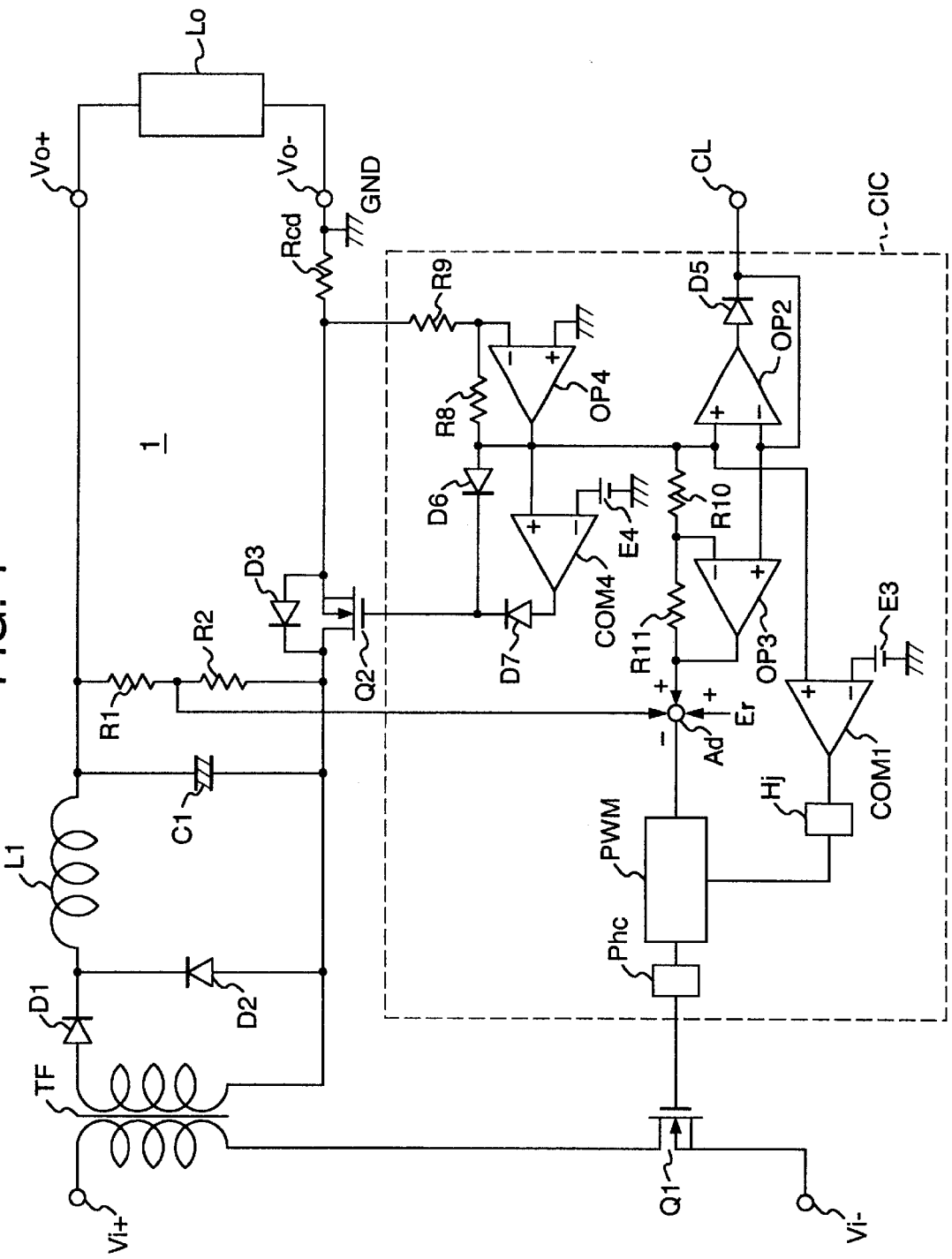
FIG. 1 is a circuit diagram according to an embodiment of the invention.
Figure 2:
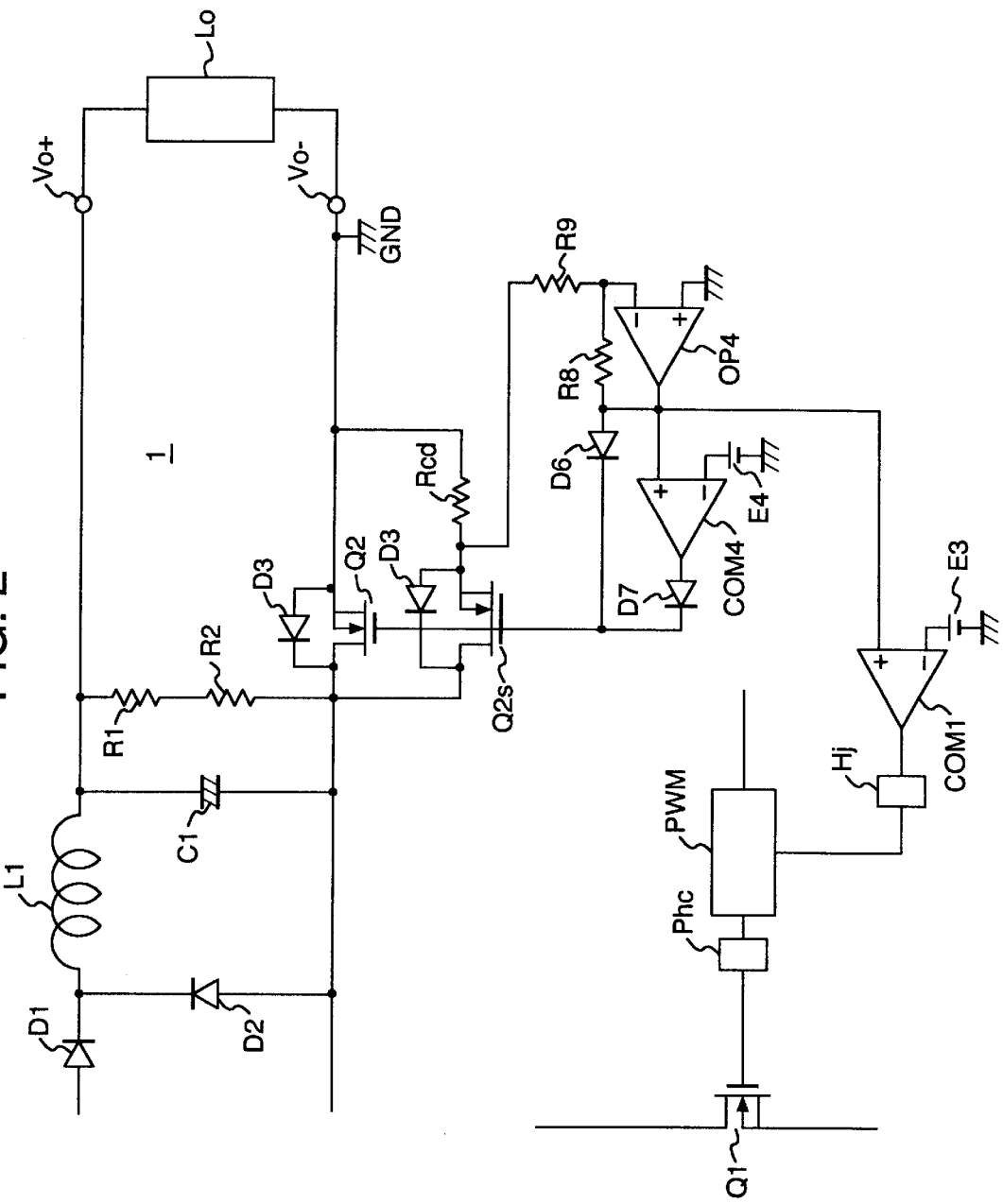
FIG. 2 is a circuit diagram according to another embodiment of the invention.
Figure 7:
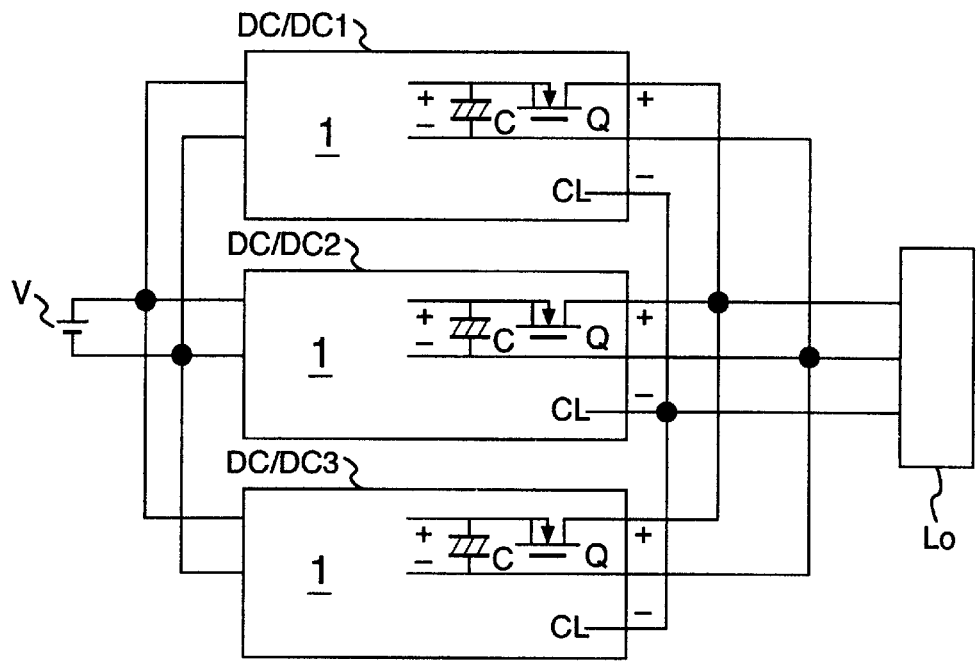
FIG. 7 is a circuit diagram in which the invention is used for parallel operation of converters according to an embodiment.

A power supply apparatus according to an embodiment of the invention is shown in FIG. 1. This embodiment represents an internal configuration of a DC/DC convertor for parallel redundancy operation shown in FIG. 7. FIG. 7 shows an example of the parallel redundancy operation of three converters each connected to a load Lo through a reverse current-blocking MOSFET Q. Further, each converter is connected to a terminal CL for controlling the current balance.

In the basic configuration of the forward-type DC/DC converter 1 shown in FIG. 1, the primary winding of a transformer TF is impressed with a DC voltage Vi through a main switch Q1. The switching operation of the main switch Q1 is controlled by a control circuit CIC defined by dashed line on the secondary of the transformer TF. The secondary main circuit of the transformer included diodes D1 and D2 for rectification and smoothing, an inductance L1, a capacitor C1, a reverse current-blocking MOSFET Q2, a diode D3 (which may be a parasitic diode for the MOSFET) and a current-detecting resistor Rcd. When the main switch Q1 is turned on/off by this circuit at a predetermined frequency, a voltage proportional to the duty factor which is the ratio of the turn-on time to the switching period is obtained on the secondary side of the transformer. This voltage is rectified by the diode D1 and used for charging the capacitor C1 through the inductance L1. When the main switch Q1 turns off and the primary voltage drops to zero, the secondary voltage changes to the reverse direction, and therefore the diode D1 turns off by being biased reversely. Thus, the energy that has been stored in the inductance L1 is released, so that the current continues to flow through the capacitor C1 and the diode D2. In this way, the voltage is rectified and smoothed, and the voltage across the capacitor becomes a DC voltage with a small ripple. The load Lo is driven by this voltage.

Now, the reverse current-blocking operation of the control circuit CIC will be explained. The MOSFET Q2 and the diode D3 are connected in parallel to each other, and the parallel circuit is connected in series to a current-detecting resistor Rcd and further to the negative side of the output terminal of the converter 1. The two terminals of the current-detecting resistor Rcd are connected to an amplifier OP4. As shown, however, the ground GND side of the resistor Rcd is connected to the positive input terminal of the amplifier OP4, and the other side is connected to the negative input terminal of the amplifier OP4 through a resistor R9. A resistor R8 is inserted between the negative input terminal and the output terminal of the amplifier OP4 thereby to constitute an amplifier having a gain of R8/R9. Further, the positive input terminal of a comparator COM4 is connected to the output terminal of the amplifier OP4, and the negative input terminal of the comparator COM4 is connected to a reference voltage E4. The outputs of the amplifier OP4 and the comparator COM4 are connected to the gate of the MOSFET Q2 through diodes D6 and D7, respectively. When the converter 1 is activated in this configuration, the MOSFET Q2 remains off while the output voltage of the converter 1 is lower than the voltage Vo of the load being driven by the converter 1 of the other redundant system. Thus, the charge current for the capacitor C1 from the other redundant system is blocked by the diode D3. When the voltage across the converter 1 increases to the voltage Vo of the load or more with the progress of the activation, the diode D3 is biased in forward direction and the current begins to flow. This current is amplified by the amplifier OP4. When the output voltage of the amplifier OP4 increases to the forward voltage of the diode D6 constituting a first reference value, the output voltage of the amplifier OP4 increases in proportion to the magnitude of the resultant current. The output voltage of the amplifier OP4 makes up the first control signal (gate signal) for the MOSFET Q2, and the gate voltage of the MOSFET Q2 is increased. As a result, the MOSFET Q2 gradually begins to conduct while the MOSFET Q2 remains non-saturated, and the current gradually begins to transfer from the diode D3 to the MOSFET Q2. Thus, the forward voltage of the diode D3 occurs. When the activation current of the converter is further increased to such an extent that the output voltage of the amplifier OP4 reaches the second reference value E4, the output of the comparator COM4 turns on. This output signal is applied as a second control signal (gate signal) to the MOSFET Q2. The output of the comparator COM4 is set to a magnitude not smaller than the first control signal, and therefore the MOSFET Q2 is turned on to a sufficient degree. At the same time, the MOSFET Q2 operates in the saturated area, and the current transfers sufficiently from the diode D3 to the MOSFET Q2 thereby completing the activation.

The aforementioned reverse current-blocking operation of the control circuit CIC limits the current when the MOSFET Q2 starts to turn on at the time of activating the converter 1, and therefore the current is prevented from being increased so abruptly as to cause a load variation. These effects are achieved also in the case where the MOSFET Q2 operates in an area slightly displaced from the non-saturated or saturated area under the control of the first and second control signals.

A voltage control system for controlling the output voltage at a constant level is also required. In a configuration of this system, the resistors R1 and R2 are connected to the terminals of the capacitor C1 in order to detect the output voltage and a detection voltage Vd is obtained from the middle point thereof. This voltage is compared with the reference voltage Er in an adder Ad, and in the case where the detection voltage Vd is lower than the reference voltage Er, an error voltage proportional to the difference is input to a PWM converter PWM which outputs a pulse voltage with a duty factor increased in accordance with the error voltage. This output is applied through insulating means such as a photocoupler Phc as a control signal to the main switch Q1 on the primary side of the transformer TF thereby to drive the same switch Q1. In this way, the converter 1 is controlled so that the output voltage is increased and the reference voltage Er coincides with the detection voltage Vd. As a result, the output voltage vo can be controlled to the desired value. The first reference value, though fixed as a voltage across the diode D6 in the case under consideration, may be rendered adjustable using an adjustable source voltage. Also, the second reference value E4 may of course be rendered adjustable using an adjustable voltage source.

Further, in order to control the current balance for the parallel redundancy operation, the output of the current amplifier OP4 is connected to the positive input terminal of the amplifier OP2 and the negative input terminal of the amplifier OP3 through the resistor R10. The output of the amplifier OP2 is connected to the negative input terminal, the positive input terminal of the amplifier OP3 and the current control line terminal CL through the diode D5. The output of the amplifier OP3 is connected to the positive input terminal of the adder Ad and the resistor R11. The positive input terminal of the adder Ad is connected to the reference voltage Er, and the other negative input terminal of the adder Ad is impressed with the voltage (substantially equal to the output voltage) across the capacitor C1 of the converter 1, divided by the resistors R1 and R2. The output of the adder Ad is insulated from the PWM converter PWM through the photocoupler Phc and connected to the gate of the main switch Q1 of the converter 1. Among the converters performing the redundancy operation with this configuration, the output current value of the converter 1 producing the maximum current is obtained from the current control line terminal CL. The value of this current is compared with the current value of the principal converter 1 in the amplifier OP2, and the larger one of the currents is output to the current control line terminal CL. Therefore, the maximum current in the converters operating in parallel always exists at the current control line terminal CL. The amplifier OP3 also amplifies the difference between the current value of the principal converter 1 and the maximum current value with the gain of R11/R10, and the error output is added to the reference value Er in the adder Ad. Assuming that the current of the principal converter 1 is smaller than the maximum value, the output of the amplifier OP3 increases and so does the output of the adder Ad. Thus, the duty factor of the output of the PWM converter PWM increases, with the result that the voltage of the principal converter slightly increases for an increased current share of the principal converter 1. This method of balancing the current between the converters is called the maximum current following control for the present purpose.

Now, the overcurrent protection function will be explained. The negative input of the comparator COM1 is connected to a reference voltage E3, and the positive input thereof is connected to the output of the amplifier OP4 which is the current value of the converter 1. The output of the comparator COM1 is connected through a holding circuit Hj to the PWM converter PWM. As long as the current of the converter 1 is small, the output of the comparator COM1 is at low (L) level and so is the output of the holding circuit Hj. The PWM converter, therefore, operates in accordance with the output of the adder Ad. Once the current increases abnormally for some reason to a value not less than the reference voltage E3 which is an overcurrent reference value, however, the output of the comparator COM1 becomes high (L). The output of the holding circuit Hj is also maintained at H level, so that the output of the PWM converter PWM is stopped thereby continuing to turn off the main switch Q1. The circuit is reset by a restoration switch, not shown, of the holding circuit Hj. The circuit of this configuration can also be controlled in such a manner that the MOSFET Q2 is turned on consciously to pass through the non-saturated area for a longer time after detection that the current has begun to flow in the principal converter 1, while the MOSFET Q2 is turned off so that the non-saturated area is passed for a shorter time than when the MOSFET Q2 is on, upon detection that the current of the principal converter 1 has flowed in the direction reverse to the case where the current is supplied to the load.

The circuit of FIG. 1 operates as described above, and therefore can be restored to the redundant system automatically even in the case of dynamic attachment and removal during the parallel redundancy operation, thereby making it possible to reduce the voltage variation of the redundant system. Further, as shown, in the case where the MOSFET Q2 and the current-detecting resistor Rcd are arranged on the negative side of the output of the converter 1, the control circuit CIC defined by the dashed line remains at low voltage except for the photocoupler and therefore there is no need of insulation for current detection, thereby leading to the advantage that a monolithic IC can be easily produced. Also, in view of the fact that the control circuit CIC is arranged on the negative voltage side on the secondary of the transformer and therefore only the signal for driving the main switch Q1 is sufficiently insulated, the use of the photocoupler can minimize the effect of noises and can configure a simple, inexpensive circuit.

In the basic configuration of the forward-type DC/DC converter 1 shown in FIG. 1, the primary winding of a transformer TF is impressed with a DC voltage Vi through a main switch Q1. The switching operation of the main switch Q1 is controlled by a control circuit CIC defined by dashed line on the secondary of the transformer TF. The secondary main circuit of the transformer included diodes D1 and D2 for rectification and smoothing, an inductance L1, a capacitor C1, a reverse current-blocking MOSFET Q2, a diode D3 (which may be a parasitic diode for the MOSFET) and a current-detecting resistor Rcd. When the main switch Q1 is turned on/off by this circuit at a predetermined frequency, a voltage proportional to the duty factor which is the ratio of the turn-on time to the switching period is obtained on the secondary side of the transformer. This voltage is rectified by the diode D1 and used for charging the capacitor C1 through the inductance L1. When the main switch Q1 turns off and the primary voltage drops to zero, the secondary voltage changes to the reverse direction, and therefore the diode D1 turns off by being biased reversely. Thus, the energy that has been stored in the inductance L1 is released, so that the current continues to flow through the capacitor C1 and the diode D2. In this way, the voltage is rectified and smoothed, and the voltage across the capacitor becomes a DC voltage with a small ripple. The load Lo is driven by this voltage.

The operation of this embodiment is similar to that of the embodiment shown in FIG. 1. Specifically, the voltage is low and the diodes D3 and D3s are reversely biased so that no current flows at the time of activation of the converter 1. When the voltage increases near to the load voltage Vo of the redundant system, the current begins to flow through the diodes D3 and D3s. This current is detected by the resistor Rcd and amplified by the amplifier OP4 in the same manner as in FIG. 1 and the output voltage of the amplifier OP4 increases to the forward voltage of the diode D6 providing the first reference value, the output voltage of the amplifier OP4 increases in accordance with the magnitude of the same current. As a result, the gate voltages of the MOSFETs Q2 and Q2s increase. Thus, the MOSFETS Q2 and Q2s gradually begin to conduct in non-saturated state, so that the current gradually begins to transfer from the diodes D3 and D3s to the MOSFETs Q2 and Q2s, and the forward voltage of the diodes D3 and D3s also drop. When the current of the converter 1 at the time of activation is further increased and the output voltage of the amplifier OP4 reaches the second reference value E4, the output of the comparator COM4 is turned on, so that the MOSFETS Q2 and Q2s are turned on sufficiently. Thus, the current sufficient transfers from the diodes D3 and D3s to the MOSFETs Q2 and Q2s thereby to complete the activation. When the current decreases, the output of the amplifier OP4 also decreases and the MOSFETs Q2 and Q2s turn off. In the case where the reverse current flows for some reason, however, the protection circuit is turned on.

According to this embodiment, the circuit configuration is simplified and resistant to noise if the control circuit CIC shown in FIG. 1 which may be configured with a single chip has the MOSFETs Q2 and Q2s built therein.

Figure 3:
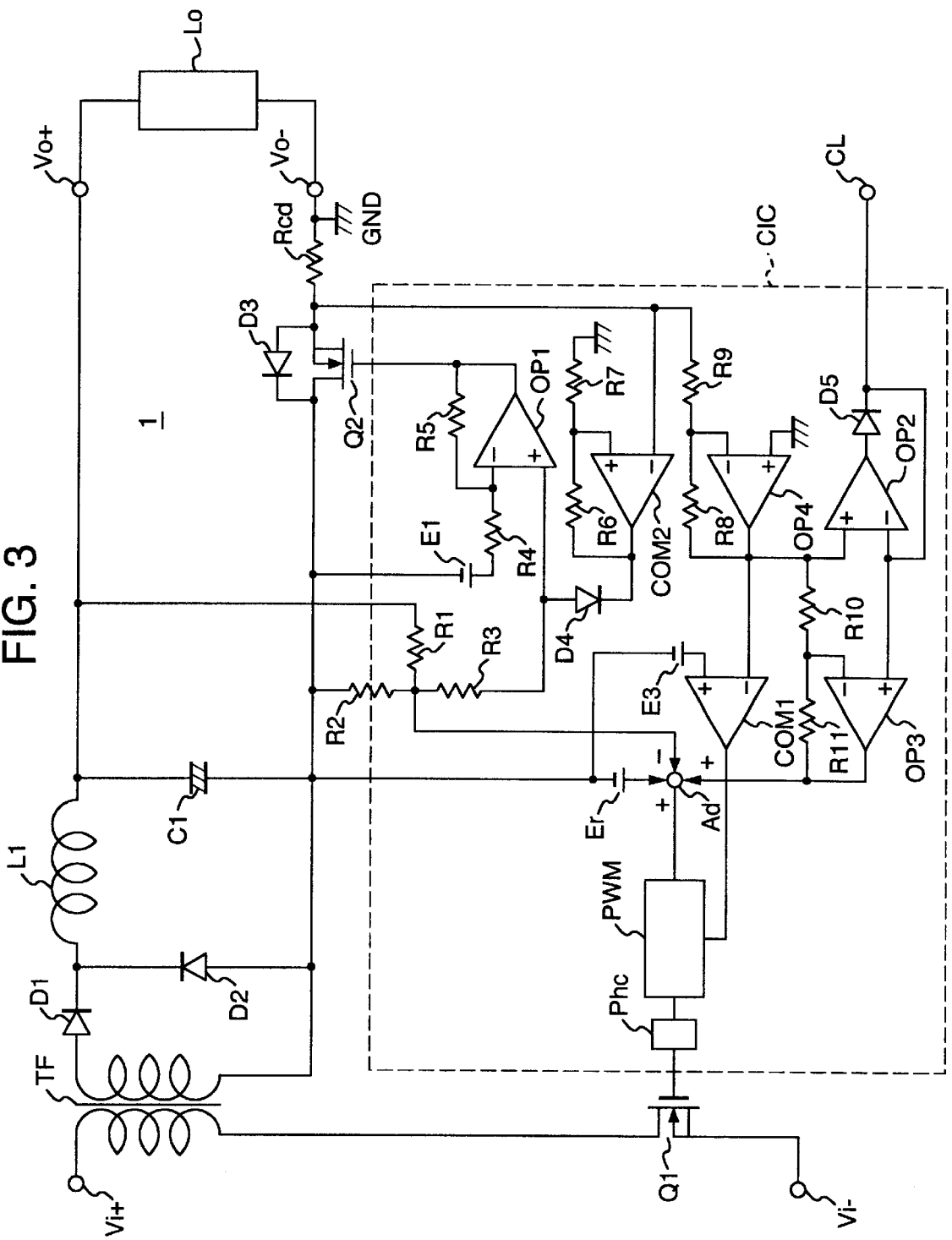
FIG. 3 is a circuit diagram according to still another embodiment of the invention.

Still another embodiment is shown in FIG. 3. This example is for determining the control of the reverse current blocking from the voltage of the principal converter. The same reference numerals as those in FIG. 1 designate the same component parts operating the same way as the corresponding parts, respectively, in FIG. 1. The voltage control, the current balance control and the over current protection functions, therefore, are the same as those shown in FIG. 1. In the control operation for the reverse current blocking, the voltage of the principal converter divided by the resistors R1 and R2 is obtained from the junction point of the resistors R1 and R2. The junction point of the resistors R1 and R2 is connected to the positive input terminal of the amplifier OP1 through the resistor R3, and further to the output of the comparator COM2 through the diode D4. The negative input of the amplifier OP1 is connected through the resistor R4 to the reference voltage E1 on the one hand and to the output of the amplifier OP1 through the resistor R5 on the other hand.

In the case where the voltage of the principal converter 1 divided by the resistors R1 and R2 is not higher than the first reference value E1, the output of the amplifier OP1 is not higher than zero and the MOSFET Q2 is maintained in its off state. Once the divided voltage of the principal converter 1 reaches the reference value E1 or higher, however, the output of the amplifier OP1 changes to positive direction, and the MOSFET Q2 turns on in its non-saturated state in accordance with the output of the amplifier OP1. With the increase in the divided voltage of the principal converter 1, the MOSFET Q2 approaches saturation, and when the divided voltage of the principal converter 1 reaches not less than the second reference value determined by the MOSFET Q2, turns on to the full. The current first flows in a greater amount in the diode D3 followed by gradual, smooth transfer to the MOSFET Q2. At a certain time, the current flows in the MOSFET Q2 for the most part. In the case where the reverse current flows in the MOSFET Q2 for some reason, the reverse current is detected by the comparator COM2 through the current detecting resistor Rcd, and the MOSFET Q2 is turned off to prevent the reverse current by shorting the positive input of the amplifier OP1 using the output of the comparator COM2 through the diode D4.

Figure 4:
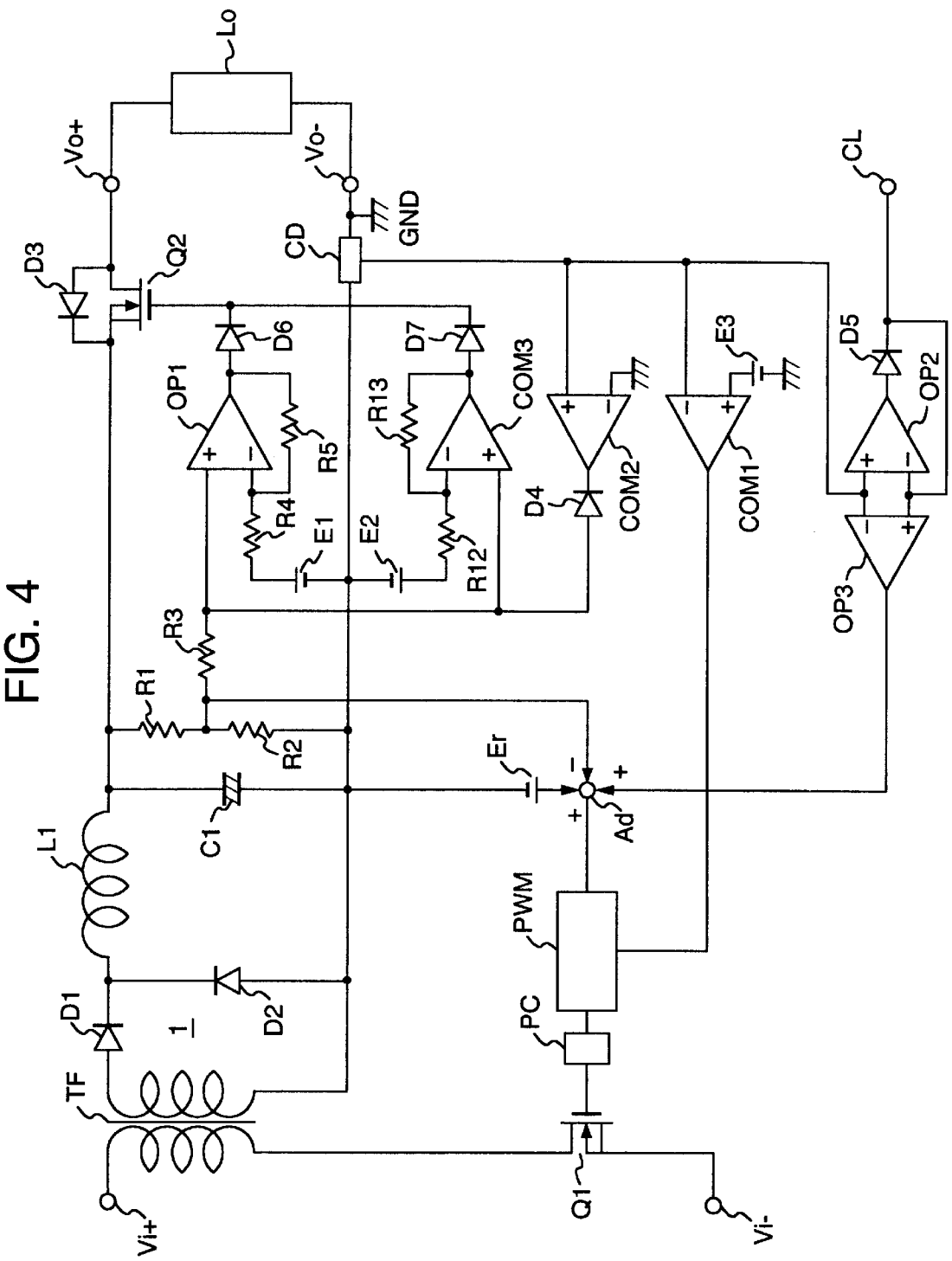
FIG. 4 is a circuit diagram according to a further embodiment of the invention.

FIG. 4 shows an example of the reverse current-blocking MOSFET Q2 arranged on the positive side of the output of the converter 1 according to still another embodiment. The reference numerals identical to those in FIG. 3 designate the component parts operating the same way as the corresponding parts in FIG. 3, respectively. This configuration is different from that of FIG. 3 in the provision of the comparator COM3 for comparing the voltage with the second reference value E2 for reverse current prevention control in addition to the provision of the reverse current-blocking MOSFET described above. The junction point of the resistors R1 and R2 is connected to the positive input of the amplifier OP1 and the positive input of the comparator COM3 through the resistor R3. The negative input of the comparator COM3 is connected to the reference value E2 through the resistor R12 on the one hand and to the output of the comparator COM3 through the resistor R13 on the other hand. The outputs of the comparator COM3 and the amplifier OP1 are connected to the gate of the MOSFET Q2 through the diodes D7 and D6, respectively.

In the embodiment shown in FIG. 4, in the case where the divided voltage of the principal converter 1 is not higher than the first reference value E1, the output of the amplifier OP1 is not higher than zero, so that the MOSFET Q2 is maintained in its off state. Once the divided voltage of the principal converter 1 reaches the reference value E1 or higher, the output of the amplifier OP1 turns positive in direction so that the MOSFET 02 turns on in its non-saturated state in accordance with the output of the amplifier OP1. With the increase in the divided voltage of the principal converter 1, the MOSFET Q2 approaches the on state in saturation. When the divided voltage of the principal converter further increases to the second reference value E2 or higher, the output of the comparator COM3 turns high and the MOSFET Q2 turns on to the full. According to this embodiment, the output current is detected by a current sensor CD. Also, the operation and other points with a reverse current flow are the same as those in FIG. 3. This embodiment is applicable to an ordinary converter configuration.

Figure 5:
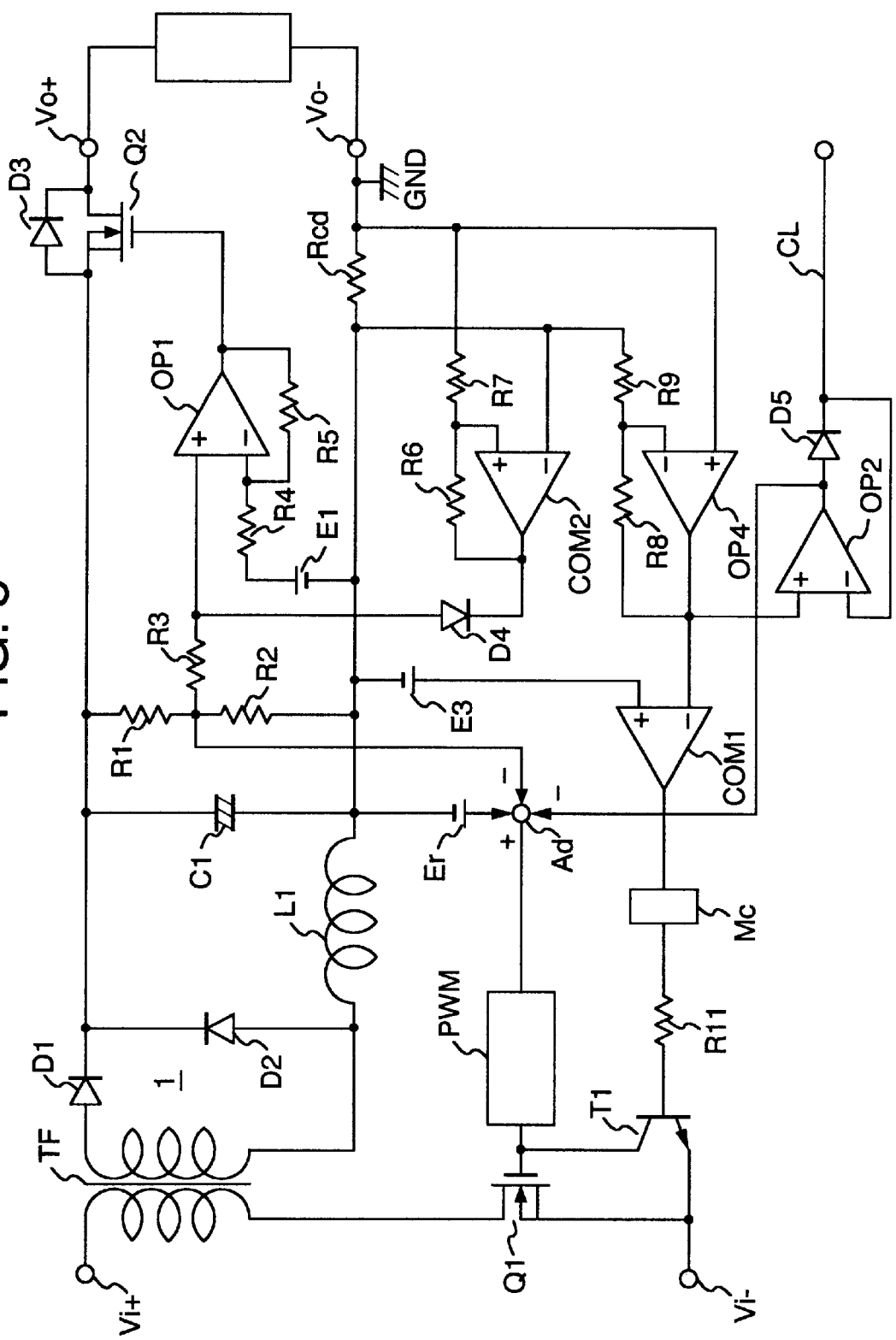
FIG. 5 is a circuit diagram according to a still further embodiment of the invention.

FIG. 5 shows a further embodiment in which the reverse current-blocking MOSFET Q2 is arranged on the positive side of the output of the converter 1 and the smoothing inductance L is arranged on the negative side of the output of the converter 1. The same reference numerals as the corresponding ones in FIGS. 3 and 4 designate the same component parts, respectively, performing the control operation in the same way as in FIGS. 3 and 4. As a configuration for current balance control, the amplifier OP3 is omitted and doubled by the amplifier OP2 and the output of the amplifier OP2

The operation of blocking the reverse current flow according to this embodiment is similar to that of the embodiment shown in FIG. 3. Specifically, as long as the voltage of the principal converter 1 divided by the resistors R1 and R2 is not higher than the first reference value E1, the output of the amplifier OP1 is not higher than zero and the MOSFET Q2 is maintained in its off state. Once the divided voltage of the principal converter 1 reaches the first reference value E1 or higher, on the other hand, the output of the amplifier OP1 turns positive in direction, and the MOSFET Q2 is turned on in its non-saturated state in accordance with the output of the amplifier OP1. With the increase in the divided voltage of the principal converter 1, the MOSFET Q2 approaches the on state in saturation, and is turned on to the full when the divided voltage of the principal converter 1 reaches the second reference value determined by the MOSFET Q2. The current first flows in a greater proportion in the diode D3 and smoothly transfers to the MOSFET Q2, and at a predetermined point, most of the current begins to flow to the MOSFET Q2 in the case where the reverse current flows in the MOSFET Q2 for some reason, the reverse current is detected by the comparator COM2 through the current detecting resistor Rcd and blocked by turning off the MOSFET Q2 by shorting the positive input of the amplifier OP1 using the output of the comparator COM2 through the diode D4.

According to the embodiment of FIG. 5, in the case where the current flowing in the principal converter 1 is smaller than the maximum value for parallel operation, the output of the amplifier OP2 is decreased, and a less value is subtracted from the reference value Er in the adder Ad. As a result, the input to the PWM converter PWM increases and so does the duty factor of the PWM converter PWM. Thus, the voltage of the principal converter 1 slightly increases for an increased current into a balanced state. Also, the overcurrent protection circuit drives the transistor T1 through the holding circuit Mc and the resistor R1 by the output of the comparator COM and turns off by shorting the gate of the MOSFET Q1 of the main switching device thereby to block the overcurrent. As a result, the circuit is reduced in size and the reliability is improved by the distribution of the protection circuit.

Figure 6:
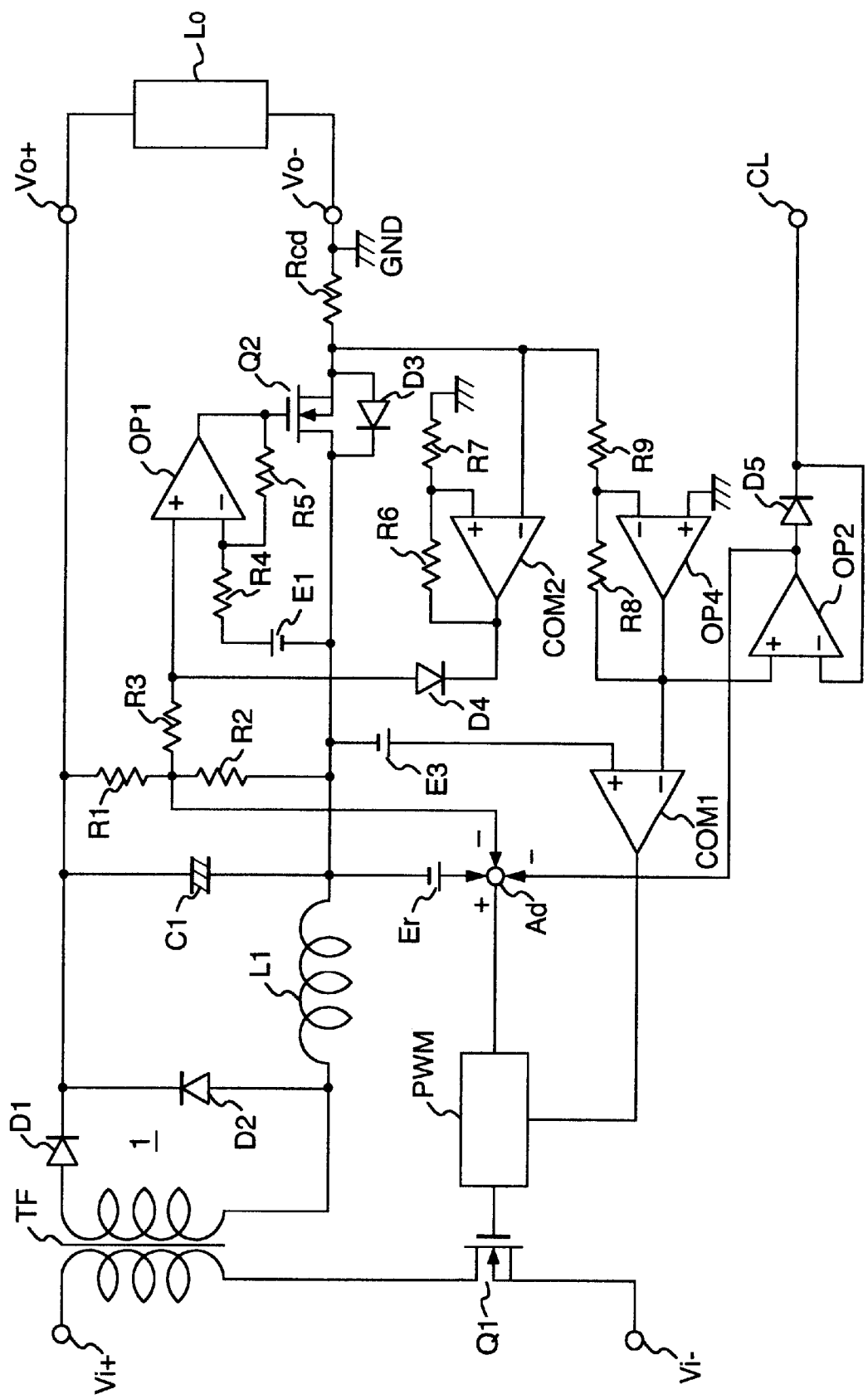
FIG. 6 is a circuit diagram according to a yet further embodiment of the invention.

FIG. 6 shows a yet further embodiment in which both the reverse current-blocking MOSFET Q2 and the smoothing inductance L are arranged on the negative side. In FIGS. 3, 4 and 5, the same reference numerals designate the same component parts operating the same way, respectively. Thus, the operation of blocking the reverse current is also the same.

FIG. 7 shows a parallel redundancy power supply driven by the driving method according to an embodiment of the invention. Three DC/DC converters are operated in parallel redundancy. Each DC/DC converter connects a load by connecting the reverse current-blocking MOSFET Q on the load side of the smoothing capacitor C. The MOSFET Q is controlled by the control circuit and the driving method explained with reference to FIGS. 1 to 6. In FIG. 7, the control circuit is not shown. Further, in each converter 1, the current is controlled by connecting the current balance control according to the maximum current following method with the current control line CL.

Figure 8:
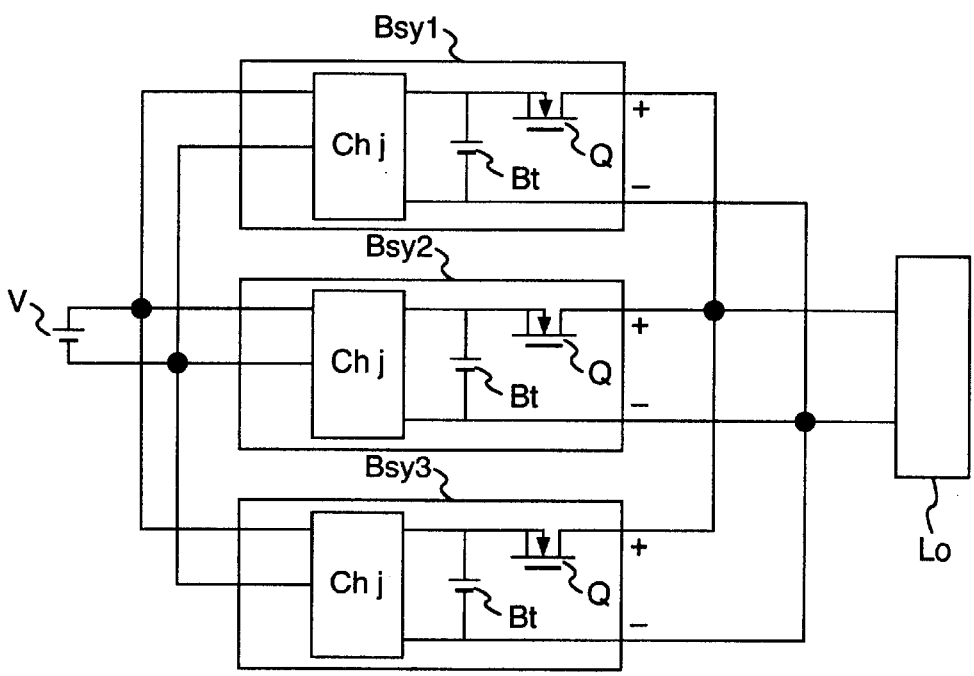
FIG. 8 is a circuit diagram in which the invention is used for parallel operation of battery units according to an embodiment.

FIG. 8 shows a parallel redundancy power supply according to still another embodiment of the invention, in which battery units are operated in parallel. Battery units Bsy1 to Bsy2 are each charged by being connected to a battery Bt through a charge control circuit Chj from a DC power supply V. Each battery Bt is connected to a load through the reverse current-blocking MOSFET Q. Though not shown or explained, the control circuit and the driving method for the reverse current-blocking MOSFET Q is the same as that for the embodiments shown in FIGS. 1 to 6.

Figure 9:
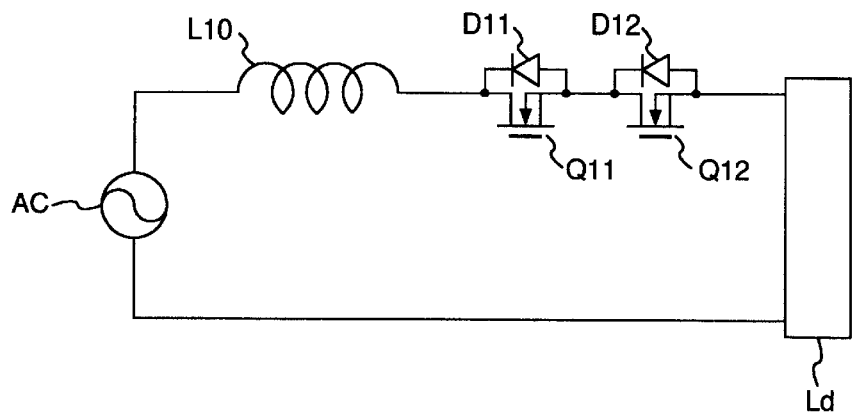
FIG. 9 is a circuit diagram in which the invention is used for an AC switch.

FIG. 9 shows a power supply apparatus having an AC switching device according to an embodiment of the invention. MOSFETs Q11 and Q12 are connected in series from an AC power supply AC through an inductance L10 to supply power to a load Ld. The MOSFETs Q11 and Q12, when turned on from off state, are controlled to turn on in saturation through a non-saturated on state from the off state, as explained with reference to FIGS. 1 to 6. In FIG. 9, the control circuit is not shown. The control timing is synchronized with the AC power supply AC. The current can be smoothly turned on/off in the switch-off operation while the current is flowing or in the switch-on operation while the voltage is impressed. According to this embodiment, the power loss of the AC switching device is reduced.

Figure 10:
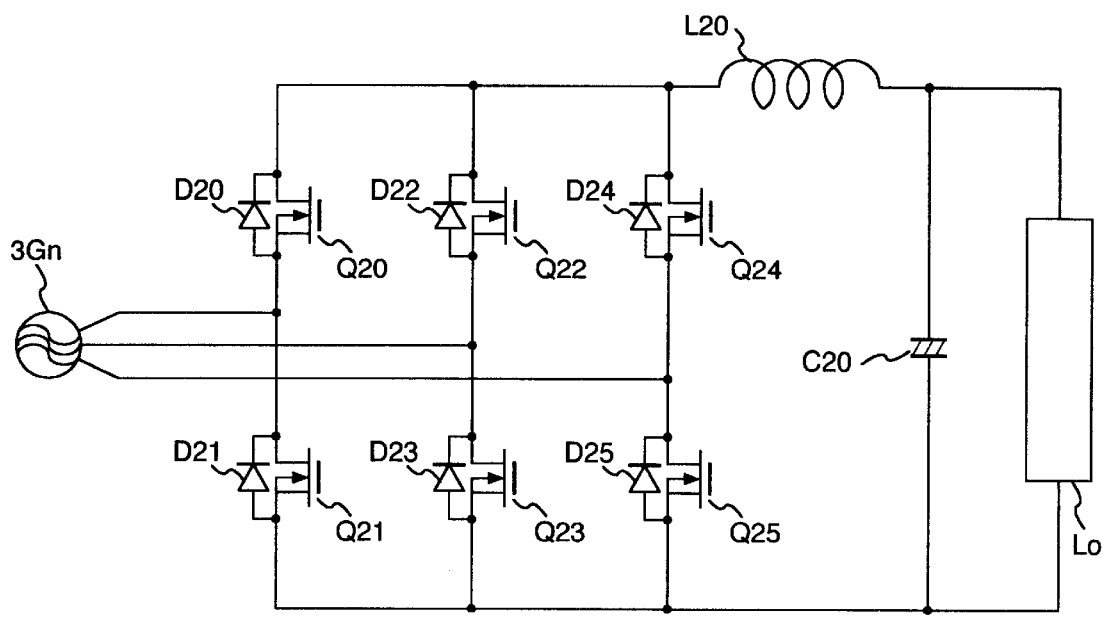
FIG. 10 is a circuit diagram in which the invention is used for rectification of the three-phase alternating current.

FIG. 10 shows the converter 1 for the three-phase AC full-wave rectification according to an embodiment of the invention. A three-phase bridge circuit for inputting a three-phase power supply 3Cn is configured as shown with switches Q20 to Q25 and diodes D20 to D25. MOSFETs Q20 to Q25 are controlled by the control circuit and the driving method as explained with reference to FIGS. 1 to 6. The MOSFETs Q20 to Q25 are switched at the control timing for each 60 degrees of the three-phase full-wave rectification. The pulsating current containing the full-wave rectified DC current is smoothed by an inductance L20 and a capacitor C20 so that the DC power is applied to the load Lo. According to this embodiment, the current smoothly transfers from the diodes to the MOSFETS, and therefore the shorting current due to the recovery of the diodes is suppressed. Thus, the noise in the three-phase AC/DC converters is reduced.

What is claimed is:

1. A method of driving a semiconductor switching device, the method comprising:
    electrically connecting the semiconductor switching device between a smoothing capacitor and a load;
    electrically connecting a diode in parallel with the semiconductor switching device; and
    driving the semiconductor switching device so as to operate in a non-saturated state upon the semiconductor switching device being turned on and so as to gradually reach a fully turned on state.

2. The method of claim 1, further comprising turning off the semiconductor switching device when one of the output voltage or output current of the power supply apparatus is not more than the first reference value.

3. The method of claim 2, further comprising the semiconductor switching device blocking a reverse current.

4. A method of driving a semiconductor switching device of a power supply apparatus for outputting power through the semiconductor switching device, the method comprising:
    electrically connecting the semiconductor switching device between a smoothing capacitor and a load;
    electrically connecting a diode in parallel with the semiconductor switching device;
    generating a control signal corresponding to a difference between one of an output voltage or an output current of the power supply apparatus and a first reference value; and
    supplying the control signal to the semiconductor switching device so as to operate the semiconductor switching device in a non-saturated state upon the semiconductor switching device being turned on.

5. The method of claim 4, further comprising generating and supplying the control signal to the semiconductor switching device so as to operate in a saturated state upon one of the output voltage or output current of the power supply apparatus being not less than a second reference value greater than the first reference value.

6. A method of driving a semiconductor switching device of a power supply apparatus for outputting power through the semiconductor switching device, the method comprising:
    electrically connecting the semiconductor switching device between a smoothing capacitor and a load;
    electrically connecting a diode in parallel with the semiconductor switching device;
    generating a first control signal corresponding to a difference between one of an output voltage or an output current of the power supply apparatus and a first reference value in accordance with an increase in the output voltage or output current of the power supply apparatus and supplying the first control signal to the semiconductor switching device to operate the semiconductor switching device in a non-saturated state; and
    generating and supplying a second control signal to the semiconductor switching device to operate the semiconductor switching device in a saturated state at and after a time point in which one of the output voltage or output current of the power supply apparatus reaches a second reference value greater than the first reference value.

7. A power supply apparatus comprising:
    a reverse current protecting semiconductor switching device electrically connected between a smoothing capacitor and a load, said semiconductor switching device outputting power to said load;
    a diode electrically connected in parallel with said semiconductor switching device; and
    a control circuit for controlling an on/off operation of said semiconductor switching device, said control circuit generating-and supplying a first control signal to said semiconductor switching device when turning on said semiconductor switching device to operate said semiconductor switching device in a non-saturated state, said first control signal corresponding to a difference between an output voltage of the power supply apparatus and a first reference value.

8. The apparatus of claim 7, said control circuit generating and supplying a second control signal to sit semiconductor switching device to operate said semiconductor switching device in a saturated state at and after a time point when said output voltage of the power supply apparatus reaches a second reference value greater than said first reference value.

9. A power supply apparatus comprising:
   a reverse current protecting semiconductor switching device electrically connected between a smoothing capacitor and a load, said semiconductor switching device outputting power to said load;
   a diode electrically connected in parallel with said semiconductor switching device; and
   a control circuit for controlling an on/off operation of said semiconductor switching device, said control circuit generating and supplying a first control signal to said semiconductor switching device when turning on said semiconductor switching device to operate said semiconductor switching device in a non-saturated state, said first control signal corresponding to a difference between an output current of the power supply apparatus and a first reference value and in accordance with an increase in said output current.

10. The apparatus of claim 9, said control circuit generating and supplying a second control signal to sit semiconductor switching device to operate said semiconductor switching device in a saturated state at and after a time point when said output current of the power supply apparatus reaches a second reference value greater than said first reference value.

11. The apparatus of claim 10, said control circuit turning off said semiconductor switching device upon one of said output voltage or output current of the power supply apparatus being not more then said first reference value.

12. The apparatus of claim 11, said semiconductor switching device blocking a reverse current.

13. A method of driving a semiconductor switching device in a power supply apparatus for outputting power through the semiconductor switching device, the method comprising:
   electrically connecting the semiconductor switching device between a smoothing capacitor and a load;
   electrically connecting a diode in parallel with the semiconductor switching device;
   generating and supplying a first control signal corresponding to a difference between an output voltage or an output current of the power supply apparatus and a first reference value to the semiconductor switching device upon activating the power supply apparatus; and
   generating and supplying a second control signal greater than the first control signal to the semiconductor switching device at and after a time point when one of the output voltage or output current of the power supply apparatus reaches a second reference value greater than the first reference value.

14. A power supply apparatus comprising:
   a reverse current protecting semiconductor switching device electrically connected between a smoothing capacitor and a load, said semiconductor switching device outputting power to said load;
   a diode electrically connected in parallel with said semiconductor switching device; and
   a control circuit for controlling an on/off operation of said semiconductor switching device, said control circuit generating and supplying a first control signal corresponding to a difference between an output voltage of the power supply apparatus and a first reference value to said semiconductor switching device upon activating the power supply apparatus and generating and supplying a second control signal greater than said first control signal to said semiconductor switching device at and after a time point when said output voltage of the power supply apparatus reaches a second reference value greater than said first reference value.

15. The apparatus of claim 14, said control circuit turning off said semiconductor switching device upon one of said output voltage or output current of the power supply apparatus being not more than said first reference value.

16. The apparatus of claim 15, said semiconductor switching device blocking a reverse current.

17. A power supply apparatus comprising:
   a reverse current protecting semiconductor switching device electrically connected between a smoothing capacitor and a load, said semiconductor switching device outputting power to said load;
   a diode electrically connected in parallel with said semiconductor switching device; and
   a control circuit for controlling an on/off operation of said semiconductor switching device, said control circuit generating and supplying a first control signal corresponding to a difference between an output current of the power supply apparatus and a first reference value to said semiconductor switching device upon activating the power supply apparatus and generating and supplying a second control signal greater than said first control signal to said semiconductor switching device at and after a time point when said output current of the power supply apparatus reaches a second reference value greater than said first reference value.

* * * * *